United States Patent
Pramanick et al.

[11] Patent Number: 6,074,937
[45] Date of Patent: Jun. 13, 2000

[54] END-OF-RANGE DAMAGE SUPPRESSION FOR ULTRA-SHALLOW JUNCTION FORMATION

[75] Inventors: Shekhar Pramanick, Fremont; Che-Hoo Ng, San Martin; Emi Ishida, Sunnyvale, all of Calif.

[73] Assignee: Advanced Micro Devices, Inc., Sunnyvale, Calif.

[21] Appl. No.: 09/058,897

[22] Filed: Apr. 13, 1998

Related U.S. Application Data

[63] Continuation-in-part of application No. 08/992,629, Dec. 18, 1997, abandoned.

[51] Int. Cl.[7] .................... H01L 21/425; H01L 21/336
[52] U.S. Cl. ................ 438/528; 438/301; 438/303; 438/305; 438/307
[58] Field of Search .................... 438/528, 305, 438/303, 301, 307

[56] References Cited

U.S. PATENT DOCUMENTS

| | | | |
|---|---|---|---|
| 5,254,484 | 10/1993 | Hefner et al. | 437/24 |
| 5,585,286 | 12/1996 | Aronowitz et al. | 437/24 |
| 5,953,615 | 9/1999 | Yu | 438/303 |

FOREIGN PATENT DOCUMENTS 2191341   7/1990   Japan .

*Primary Examiner*—John F. Niebling
*Assistant Examiner*—Alexander G. Ghyka

[57] ABSTRACT

Lightly doped regions are implanted into an amorphous region in the semiconductor substrate to significantly reduce transient enhanced diffusion upon subsequent activation annealing. A sub-surface non-amorphous region is also formed before activation annealing to substantially eliminate end-of-range defects on crystallization of amorphous region containing the lightly doped implants.

16 Claims, 8 Drawing Sheets

END-OF-RANGE DAMAGE SUPPRESSION FOR ULTRA-SHALLOW JUNCTION FORMATION

RELATED APPLICATIONS

This application is a continuation-in-part of U.S. patent application Ser. No. 08/992,629, filed Dec. 18, 1997, now abandoned, the entire disclosure of which is incorporated herein by reference.

TECHNICAL FIELD

The present invention relates to a method of manufacturing a high density semiconductor device comprising shallow junctions. The invention has a particular applicability in manufacturing high density semiconductor devices with design features of 0.25 microns and under.

BACKGROUND ART

The escalating requirements for high densification and performance associated with ultra large scale integration semiconductor device require design features of 0.25 microns and under, such as 0.18 microns and under, increased transistor and circuit speeds, high reliability and increased manufacturing throughput. The reduction of design features to 0.25 microns and under challenges the limitations of conventional semiconductor manufacturing techniques.

As design features shrink to less than about 0.25 micron, it is necessary to significantly reduce the depth of the source and drain regions below the surface of the semiconductor substrate, particularly the lightly doped source/drain regions, i.e., the junction depth ($X_J$). For example, in forming a polycrystalline silicon gate having a width of about 0.25 microns, the junction depth ($X_J$) should not exceed about 800 Å. However, the formation of a shallow $X_J$ less than about 800 Å employing conventional semiconductor manufacturing methodology is problematic.

Conventional methodology comprises implanting boron ions into regions of a crystalline silicon semiconductor substrate to form P-type source/drain regions. The boron ions are implanted at an energy selected to determine the eventual $X_J$, and at a dosage selected to control the desired concentration. As boron is an extremely light element, it must be implanted at a very low energy in order to achieve a shallow $X_J$. Accordingly, boron is typically implanted at an energy of about 5 KeV.

It has been found, however, that upon subsequent activation annealing, boron diffusion into the crystalline silicon layer proceeds apace, such that the junction depth of boron exceeds the target $X_J$ of no greater than about 800 Å. The problem of undefined $X_J$ is believed to stem from various factors. For example, boron implantation is believed to damage the monocrystalline silicon substrate generating interstitial atoms of silicon, i.e., silicon atoms that are displaced from the monocrystalline lattice to occupy spaces between silicon atoms in the monocrystalline lattice. During the high temperature activation anneal, boron diffuses into the monocrystalline silicon layer by attaching to the generated interstitial silicon atoms, causing an extremely rapid diffusion of boron into the monocrystalline silicon layer. Such a rapid boron diffusion causes the dopant profile and, hence, $X_J$, to extend below the targeted maximum of 800 Å, i.e., to a $X_J$ of about 2000 Å or deeper, notwithstanding the low initial implantation energy of about 5 KeV.

A previous approach to the undefined $X_J$ problem is disclosed in copending application Ser. No. 08/726,113 now U.S. Pat. No. 6,008,098, and comprises initially forming a surface amorphous region in the monocrystalline silicon substrate. The surface amorphous region is formed by ion implanting appropriate neutral impurities, such as germanium or silicon. Boron is then ion implanted into the essentially amorphous silicon region which does not contain any appreciable amount of interstitial silicon atoms to which boron would otherwise attach. Accordingly, upon subsequent activation annealing, rapid diffusion of boron by transient enhanced diffusion is not significant due to the substantial lack of interstitial silicon atoms and, hence, the $X_J$ can be controlled by the appropriate selection of the implantation energy. During activation annealing, the amorphous region is crystallized by solid phase epitaxy.

It was found, however, that end-of-range damage, e.g., defects, comprising dislocations and stacking faults, occurs upon crystallization of the surface amorphous region during activation annealing. Such end-of-range defects are present in a subsequently formed depletion layer resulting in leakage. Accordingly, there exists a need for a method of manufacturing a semiconductor device comprising a shallow $X_J$ employing the amorphization technique while avoiding the generation of end-of-range defects upon crystallization of the surface amorphous region.

DISCLOSURE OF THE INVENTION

An object of the present invention is a method of manufacturing a high density semiconductor device having an ultra shallow junction depth.

Another object of the present invention is a method of manufacturing a high density semiconductor device with design features of 0.25 microns and under, and an ultra shallow lightly doped source/drain junction depth.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, comprising: forming a subsurface non-amorphous ion implanted region extending below but not extending from, a surface of a semiconductor substrate to first depth; forming a surface amorphous region extending from and below the surface of a semiconductor substrate to a second depth; providing dopant impurities within the surface amorphous region; and activation annealing the dopant impurities to form lightly doped source/drain regions extending below the surface of the semiconductor substrate to a third depth.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
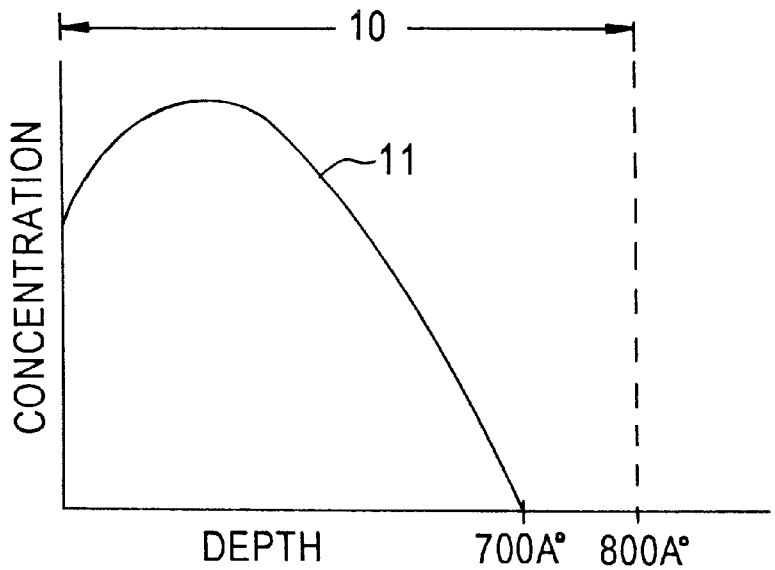
FIGS. 1 through 3 schematically illustrate the amorphization technique generation of end-of-range defects.
Figure 2:
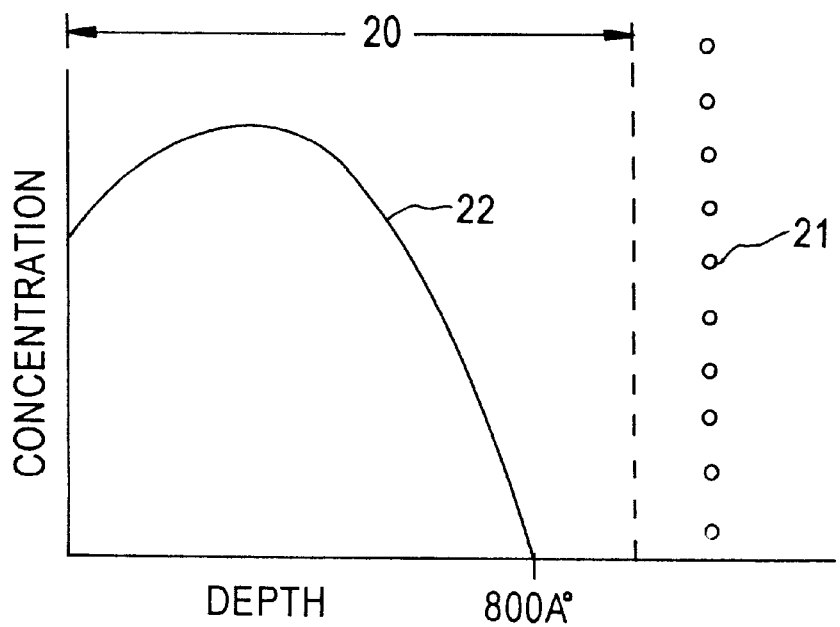

The amorphous technique comprising ion implanting dopant impurities, such as boron, at a low energy into a surface amorphous region in a semiconductor substrate to reduce transient enhanced diffusion thereby reducing $X_J$ is attendant with end-of-range defects formed upon subsequent activation annealing to form the lightly doped source/drain regions and to crystallize the surface amorphous region. The lower portion of the surface amorphous region comprises an interstitial region in which, upon subsequent crystallization, defects, such as dislocations and stacking faults, are generated, which adversely impact performance of the resulting semiconductor device. For example, as shown in FIG. 1, initial surface amorphous silicon region 10 is formed by implanting silicon or germanium ions. Subsequently, boron is implanted at a relatively low implantation energy and exhibits an impurity concentration profile 11 extending below the surface of the semiconductor substrate to a depth of about 700 Å, within the surface amorphous region which extends to a depth of about 800 Å. Subsequently, activation annealing is performed at a temperature of about 550° C. to about 950° C. to form the lightly doped source/drain regions having an impurity profile 22 (FIG. 2) which is not significantly different from the as implanted boron impurity distribution 11 shown in FIG. 1. Adverting to FIG. 2, reference numeral 20 denotes the original amorphous silicon region crystallized during activation annealing. However, end-of-range defects 21, such as dislocations and stacking faults, are generated proximate the lower terminal portion of crystallized region 20 which, if present in a depletion region, cause leakage.

Figure 3:
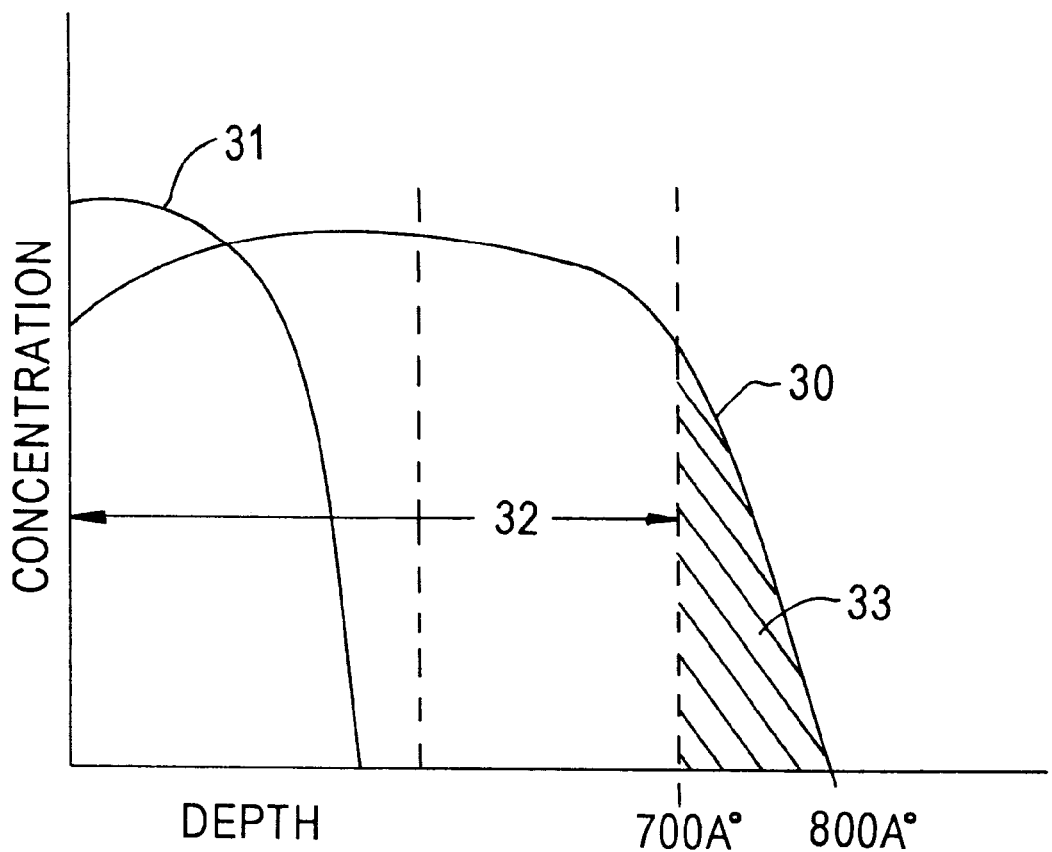

It is believed that such end-of-range defects stem from the interstitial-rich region proximate the lower portion of the surface amorphous silicon region. Adverting to FIG. 3, a surface amorphous region 32 is formed by implanting silicon, the implanted silicon having an implantation concentration profile 30. The lower portion of the silicon implantation profile is characterized by an interstitial-rich region 33. Reference numeral 31 represents the subsequently implanted boron impurity concentration profile. It is believed that after the activation anneal, the end-of-range defects are generated in the interstitial region 33 bordering the lower portion of surface amorphous region 32. It is further believed that, upon crystallization of surface amorphous region 32, interstitials in the interstitial-rich region 33 agglomerate, thereby generating the end-of-range defects.

The present invention addresses and solves problems stemming from the end-of-range defects by forming a sub-surface non-amorphous ion implanted region, either before or after forming the surface amorphous region. The sub-surface non-amorphous region extends below, but not from, the surface of the semiconductor substrate. Accordingly, a vacancy-rich region is generated between the upper portion of the sub-surface non-amorphous region and the semiconductor substrate. The sub-surface non-amorphous region is formed at a sufficient depth below the surface of the semiconductor substrate, so that the generated vacancy-rich region substantially overlaps the interstitial region generated when forming the surface amorphous region. The overlapping vacancy-rich and interstitial-rich regions result in the substantial annihilation of the interstitials in the interstitial-rich region. Accordingly, upon subsequent activation annealing and crystallization of the amorphous regions, there is no substantial agglomeration of interstitials and, hence, substantial end-of-range defects proximate the surface amorphous region are not generated.

An interstitial-rich region is also generated bordering the lower portion of the sub-surface non-amorphous region. However, upon annealing, no end-of-range defects are formed. Since the sub-surface layer is not amorphous, sufficient interstitial density is lacking to form end-of-range defects such as dislocations, loops and stacking faults.

In an embodiment of the present invention, the sub-surface non-amorphous region is formed by ion implanting inert impurities, such as silicon or germanium, at a higher energy than that employed when ion implanting inert impurities form the surface amorphous region. However, in forming the sub-surface non-amorphous region, a lower dose of impurities is typically employed.

Generally, the dose threshold for silicon amorphization is $1 \times 10^{15}$ atoms/cm$^2$ for silicon ion implantation and $3 \times 10^{14}$ atoms/cm$^2$ for germanium ion implantation. Thus, in forming the sub-surface non-amorphous ion implanted regions with silicon or germanium, the ion implantation dose is lower than their respective amorphization doses.

Given the objectives of the present invention, the implantation dosages and energies in forming the amorphous regions as well as the lightly doped and moderately or heavily doped source/drain regions can be readily determined for a particular situation. After formation of the sub-surface non-amorphous and the surface amorphous region, a dopant such as boron is implanted at a suitable dosage typically about 5 KeV or less. Moderately or heavily doped regions are implanted consistent with conventional practices. Activation annealing is then performed at a relatively lower temperature, as about 550° C. to about 800° C., to form the lightly doped source/drain regions extending to an ultra shallow $X_J$ up to about 800 Å. However, activation annealing up to about 900° C. can be employed. The present invention enables the formation of an ultra shallow $X_J$ of about 500 Å to about 600 Å.

In an embodiment of the present invention, a sub-surface non-amorphous region is formed to extend below, but not from, a surface of the semiconductor substrate to a first depth of about 700 Å to about 900 Å. The surface amorphous region is formed to extend from and below the surface of the semiconductor surface to a second depth of about 100 Å to about 200 Å less than the sub-surface non-amorphous region, e.g., about 500 Å to about 800 Å. Advantageously, the present invention enables the use of a low temperature activation anneal of about 550° C. to about 800° C. when activating to form the lightly doped source/drain region.

In accordance with the present invention, the main, i.e., moderate or heavily doped, source/drain regions are preferably formed prior to formation of the lightly doped region in a conventional manner as by forming sidewall spacers on a gate electrodes stack, ion implanting impurities and high temperature activation annealing. Thus, when activating to form the lightly doped source/drain region, a low temperature anneal can be formed, thereby minimizing diffusion and maintaining an ultra shallow $X_J$.

Figure 4:
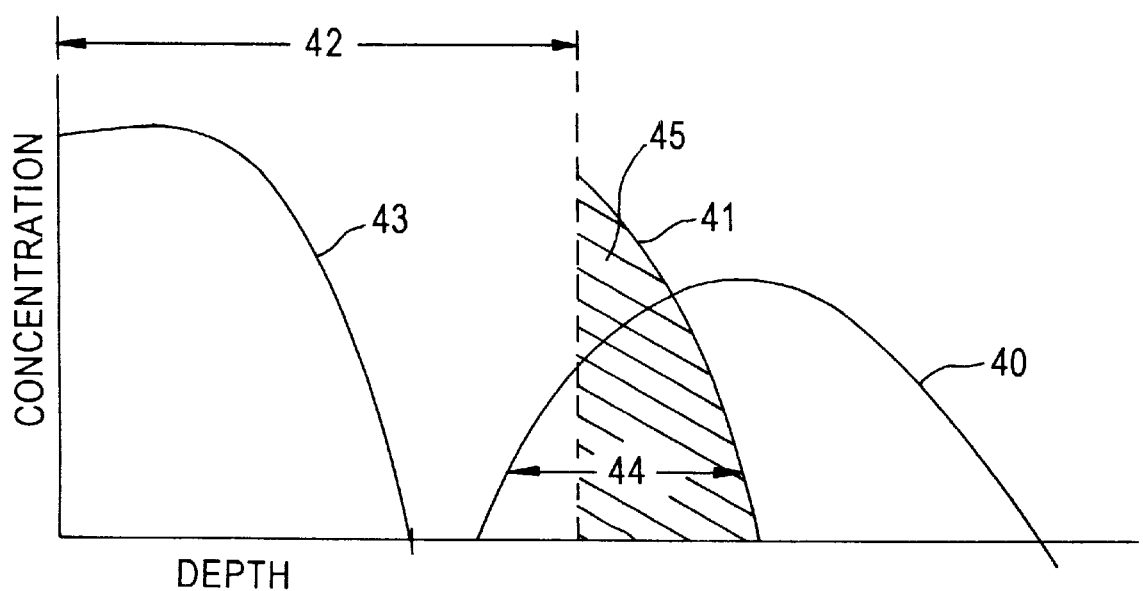
FIGS. 4 and 5 illustrate an embodiment of the present invention comprising the formation of a sub-surface non-amorphous ion implanted region.
Figure 5:
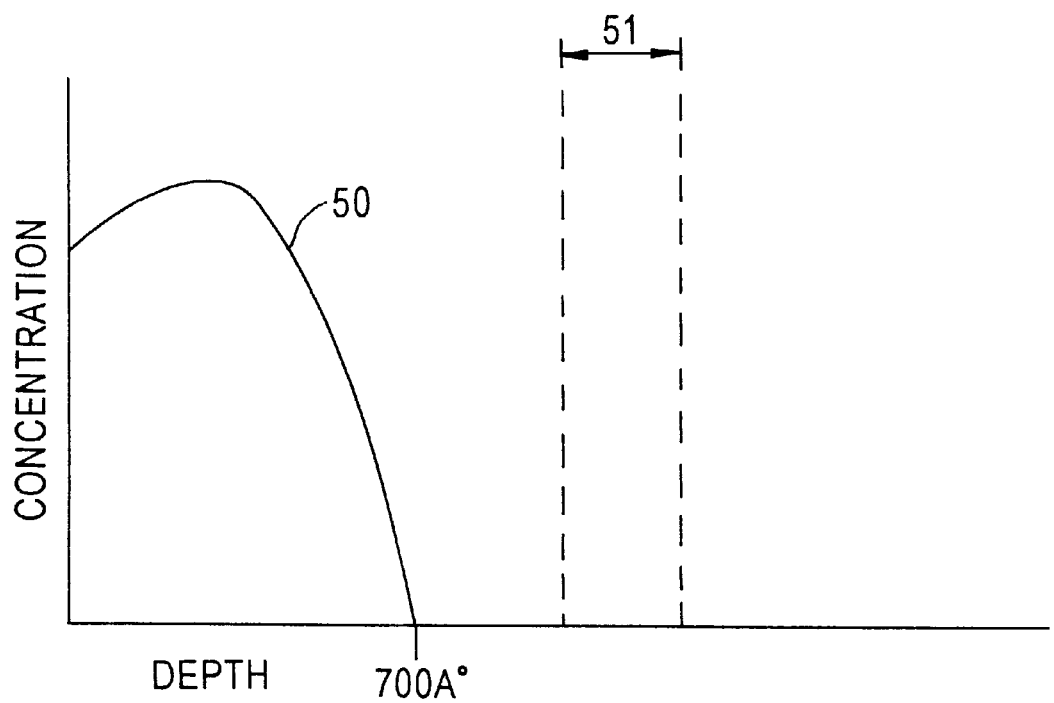

Adverting to FIG. 4, the sub-surface non-amorphous implantation profile 40 in accordance with the present invention generates a vacancy-rich region 44. The ion implanted surface amorphous region 42 is characterized by an impurity implantation profile 41 generating an interstitial-rich region 45 which substantially coincides with or overlaps the vacancy-rich region 44. Accordingly, the interstitials in the interstitial-rich region 45 are substantially annihilated by the vacancy-rich region 44. Upon subsequent activation annealing wherein the amorphous regions are crystallized, end-of-range defects do not occur in the interstitial-rich region generated by ion implantation to form the surface amorphous region 42. Reference numeral 43 denotes the as implanted dopant, e.g., boron, concentration profile. As shown in FIG. 5, a lightly doped source/drain region having an ultra shallow $X_J$ of about 700 Å is attained without end-of-range defects which would normally occur in region 51 but for the formation of a sub-surface non-amorphous region in accordance with the present invention.

Figure 6:
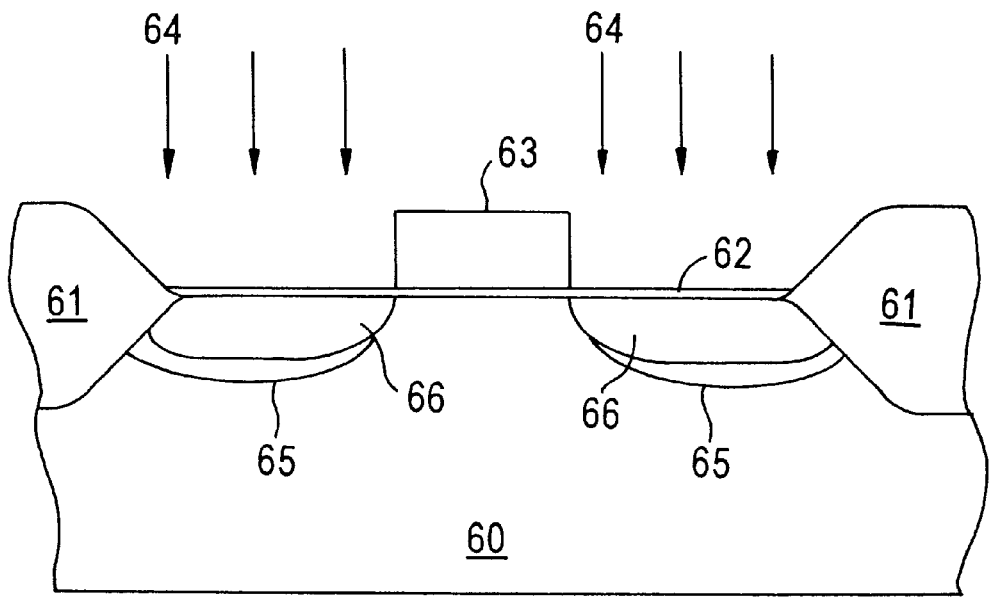
FIGS. 6 through 8 schematically illustrate different phases of an embodiment of the present invention.
Figure 7:
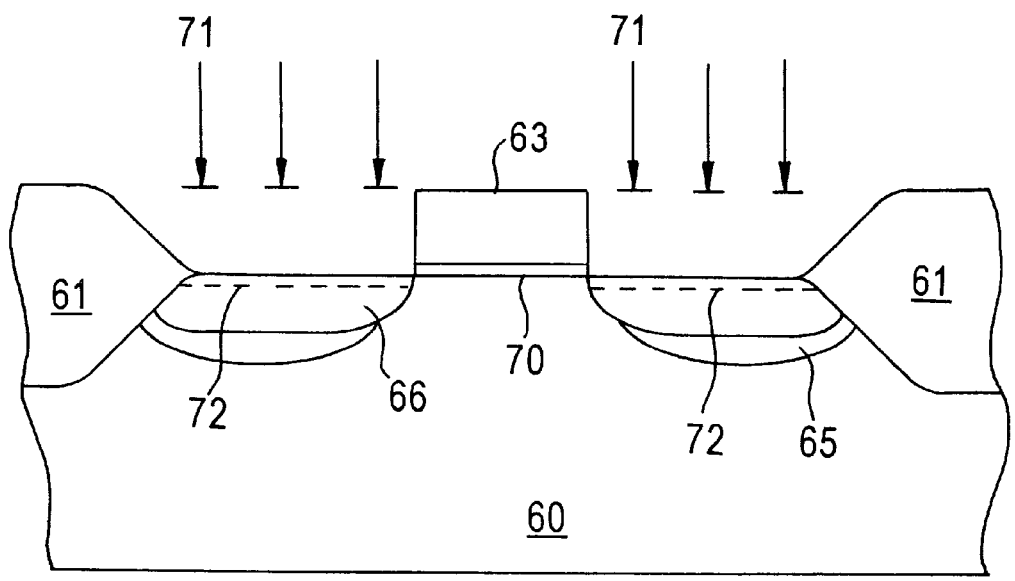
Figure 8:
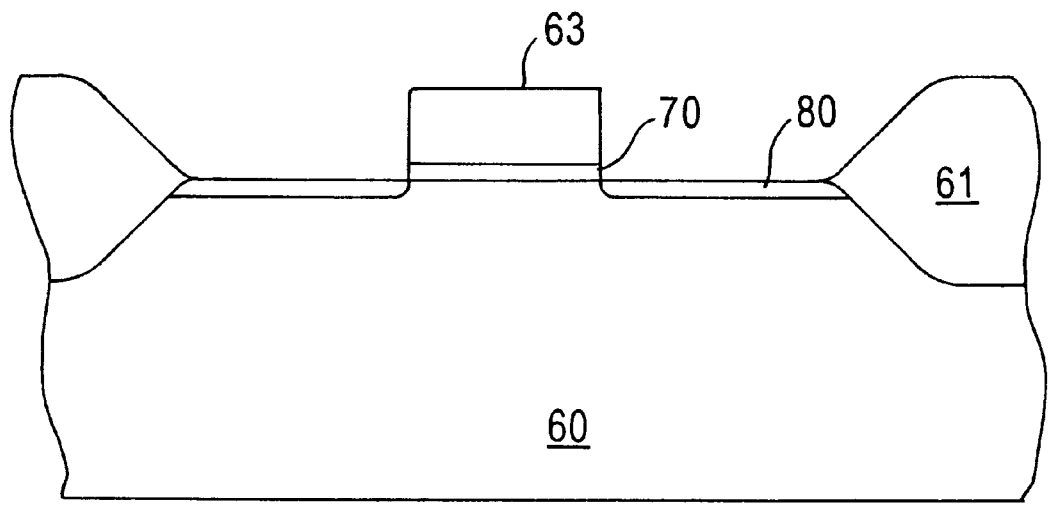

An embodiment of the present invention is schematically illustrated in FIGS. 6 through 8, wherein similar reference numerals denote similar features. As shown in FIG. 6, semiconductor substrate 60 comprises an N- or P-type doped monocrystalline silicon, or an N- or P-well formed in a P- or N-doped semiconductor substrate. Field oxide region 61 is formed to isolate an active region and an oxide layer 62 is formed on the surface of semiconductor substrate 60. A layer of conductive material, such as polycrystalline silicon, is formed on dielectric layer 62 and patterned to form gate electrode 63. Ion implantation is then conducted, as shown by arrows 64, using gate electrode 63 as a mask, to form sub-surface non-amorphous region 65 extending below, but not from, the surface of the semiconductor substrate to a first depth of about 800 Å. Ion implantation is also conducted to form surface amorphous region 66 extending from and below the surface of the semiconductor substrate 60 to a second depth less than the first depth. In forming surface amorphous region 66, a lower implantation energy and higher dosage is employed vis-à-vis the implantation energy and dosage employed when forming sub-surface non-amorphous region 65.

In carrying out the present invention, surface amorphous region 66 can be formed before or after forming sub-surface non-amorphous region 65. In forming sub-surface non-amorphous region 65, a vacancy-rich region is generated between the upper portion of sub-surface non-amorphous region 65 and the surface of the semiconductor substrate. In forming the surface amorphous region 66, an interstitial-rich region is generated proximate the lower portion of surface amorphous region 65 substantially overlapping the vacancy-rich region generated on forming sub-surface non-amorphous region 65. As a result of such overlap, the interstitials in the interstitial-rich region are substantially annihilated. Accordingly, the surface and sub-surface non-amorphous regions can be formed in any order.

Adverting to FIG. 7, dielectric layer 62 is patterned to form gate oxide layer 70. Ion implantations to form the sub-surface non-amorphous and surface amorphous regions can be conducted prior or subsequent to patterning of the dielectric layer 62 to form gate dielectric layer 70. Dopant impurities 72, e.g., boron, are then ion implanted into surface amorphous region 66 as indicated by arrows 71. Activation annealing is then conducted at a temperature of about 550° C. to about 800° C. to form lightly doped source/drain regions 80, as shown in FIG. 8. During activation annealing, the sub-surface non-amorphous region 65 and surface amorphous region 66 are crystallized. However, end-of-range defects are not formed proximate the original lower portion of the surface amorphous region, since the interstitial-rich region generated when forming the surface amorphous region substantially overlaps the vacancy-rich region generated when implanting the sub-surface non-amorphous region, thereby substantially eliminating the interstitials. Accordingly, after crystallization, there is no substantial agglomeration of interstitials and, hence, substantial end-of-range defects are not encountered in a subsequently formed inversion layer.

Figure 9:
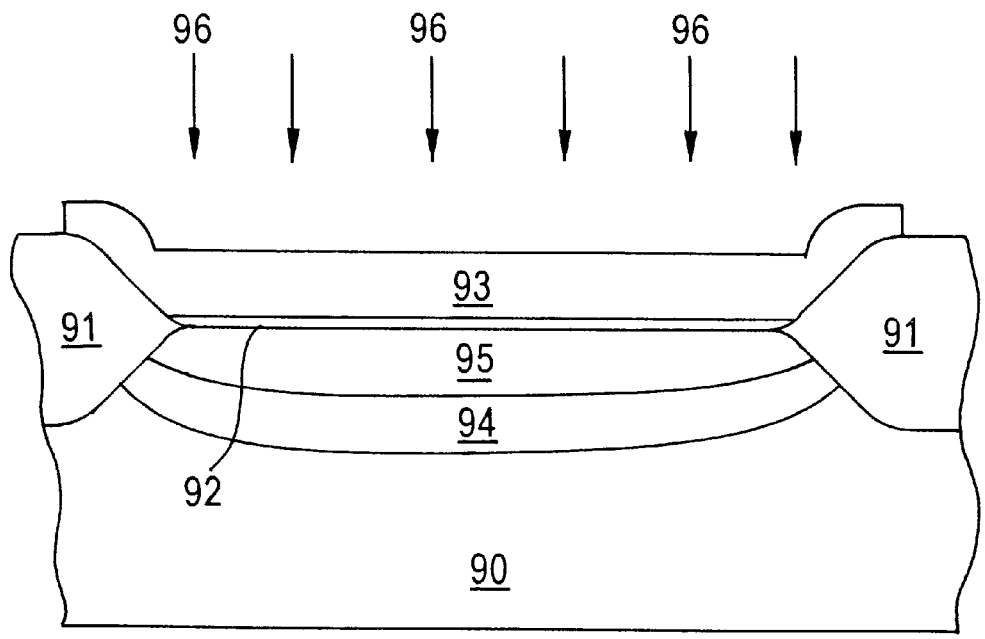
FIGS. 9 through 11 schematically illustrate different phases of another embodiment of the present invention.
Figure 10:
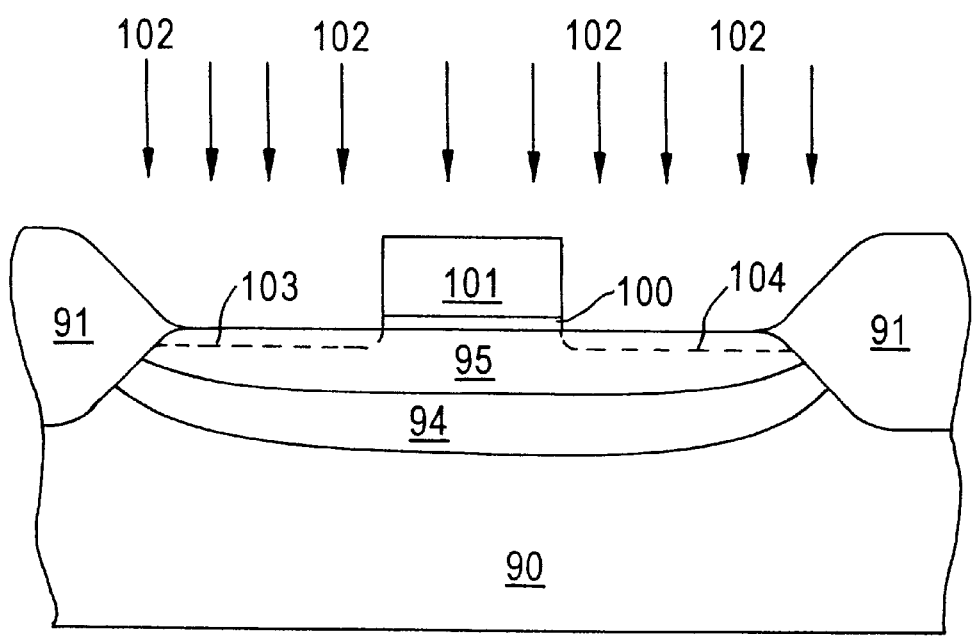
Figure 11:
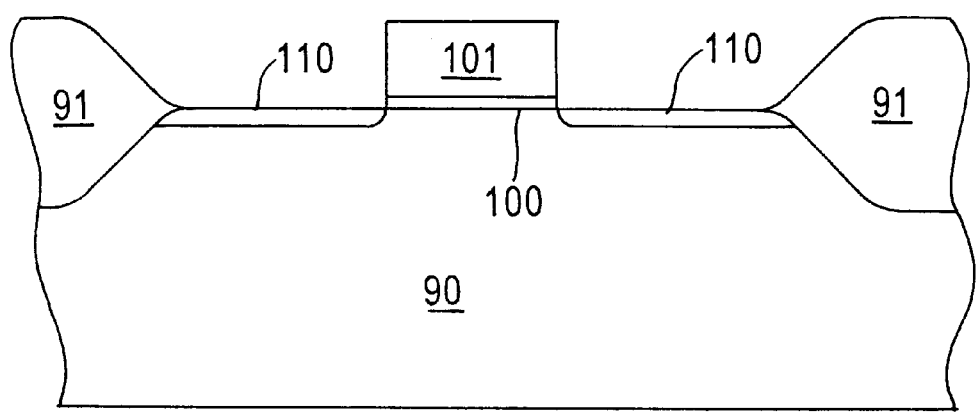

Another embodiment of the present invention is schematically illustrated in FIGS. 9 through 11, wherein similar reference numerals denote similar features. Adverting to FIG. 9, field oxide region 91 is formed in the surface of semiconductor substrate 90 to isolate an active region. A dielectric layer 92, such as silicon oxide, is formed on the surface of silicon substrate 90. Conductive layer 93, e.g., polycrystalline silicon, is formed on dielectric layer 92. A neutral impurity, such as germanium, is implanted through polycrystalline layer 93 and silicon oxide layer 92 into semiconductor substrate 90 to form sub-surface non-amorphous silicon region 94. Germanium atoms are also ion implanted through polycrystalline silicon layer 93 and silicon oxide layer 92 to form surface amorphous silicon region 95. Sub-surface non-amorphous region 94 can be formed prior or subsequent to formation of surface amorphous region 95. A vacancy-rich interstitial region is formed between sub-surface non-amorphous silicon region 94 and the main surface of the semiconductor substrate. On forming surface amorphous silicon region 95, an interstitial-rich region is formed bordering its lower portion and substantially overlapping the vacancy-rich region generated on forming the sub-surface non-amorphous silicon region 94. As a result of such an overlap, the interstitials in interstitial-rich region are substantially annihilated.

Adverting to FIG. 10, polycrystalline silicon layer 93 and silicon oxide layer 92 are patterned to form gate electrode 101 on semiconductor substrate 90 with gate dielectric layer 100 therebetween. Dopant impurities, such as boron 103, are implanted into the surface amorphous silicon region 95, as indicated by arrows 102. Activation annealing is then performed at a temperature of about 550° C. to about 800° C. to form lightly doped source/drain regions 110, shown in FIG. 11 at an ultra shallow $X_J$ no greater than about 800 Å from the surface of the semiconductor substrate. During the activation annealing, sub-surface non-amorphous silicon region 94 and surface amorphous silicon region 95 are crystallized. End-of-range defects are not present to any significant extent due to the elimination of the interstitials by substantially overlapping the vacancy-rich and interstitial-rich regions in accordance with the inventive method.

Thus, in accordance with the present invention, problematic end-of-range defects generated upon activation annealing to form lightly doped source/drain regions in a crystallized surface amorphous region at an ultra shallow $X_J$ are avoided by forming a sub-surface non-amorphous region. The present invention advantageously enables the use of a surface amorphous region to prevent diffusion of implanted lightly doped impurities on activation annealing, thereby controlling the $X_J$ by controlling the implantation energy. However, end-of-range defects are avoided by forming a sub-surface non-amorphous region, thereby generating a vacancy-rich region which substantially overlaps the interstitial region generated upon forming a surface amorphous silicon region. As a result of such overlap, the interstitials are substantially annihilated, thereby preventing agglomeration upon crystallization and the generation of end-of-range defects.

Embodiments of the present invention include formation of the main source/drain region, i.e., a moderate or heavily doped region, prior to formation of the lightly doped source/drain region having an ultra shallow $X_J$ utilizing spacers and a high temperature activation anneal. Accordingly, when forming the lightly doped source/drain regions having an ultra shallow junction depth, it is not necessary to expose the implanted impurities to a high temperature causing an undesirable increase in $X_J$.

In carrying out the embodiments of the present invention, the conductive layer can comprise any of various conductive materials typically employed in the manufacture of semiconductor devices, and is not limited to polycrystalline silicon. Similarly, the dielectric layer employed as the gate dielectric layer is not confined to silicon oxide.

In carrying out the present invention, the implantation conditions for forming the sub-surface non-amorphous silicon region and surface amorphous silicon region, so that the vacancy-rich region generated upon forming the sub-surface non-amorphous silicon region substantially overlaps the interstitial-rich region generated when forming the surface amorphous silicon region, can be readily optimized for a particular invention. The present invention enables the formation of a shallow junction at a depth less than about 800 Å, without generating any substantial end-of-range defects by agglomeration of interstitials.

The present invention is applicable to the production of various types of semiconductor devices, particularly high density semiconductor devices with submicron features of about 0.25 microns and below, exhibiting high speed characteristics and improved reliability. The present invention is cost-effective and can easily be integrated into conventional processing.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:
    ion implanting impurities to form a sub-surface non-amorphous region extending below, but not extending from, a surface of a semiconductor substrate to a first depth and generate a vacancy-rich region between the sub-surface non-amorphous region and the surface of the semiconductor substrate;
    ion implanting impurities to form a surface amorphous region extending from and below the surface of the semiconductor substrate to a second depth and generate an interstitial region substantially overlapping the vacancy-rich region;
    providing dopant impurities within the surface amorphous region; and
    activation annealing the dopant impurities to form lightly doped source/drain regions extending below the surface of semiconductor substrate to a third depth.

2. The method according to claim 1, wherein the semiconductor substrate comprises silicon.

3. The method according to claim 2, wherein the sub-surface non-amorphous and surface amorphous regions are crystallized during activation annealing.

4. The method according to claim 2, wherein the first depth exceeds the second depth.

5. The method according to claim 4, wherein the first depth exceeds the second depth by up to about 200 Å.

6. The method according to claim 5, wherein the first depth is about 700 Å to about 900 Å, and the second depth is about 500 Å to about 800 Å.

7. The method according to claim 6, wherein the third depth is less than about 800 Å.

8. The method according to claim 7, wherein the first depth is about 800 Å, the second depth is about 600 Å to about 700 Å, and the third depth is about 500 Å to about 600 Å.

9. The method according to claim 2, comprising ion implanting impurities to form the sub-surface non-amorphous and amorphous silicon regions, and ion implanting dopant impurities which form the lightly doped source/drain regions.

10. The method according to claim 1, comprising:
    implanting silicon or germanium ions to form the sub-surface non-amorphous silicon region and the amorphous silicon region.

11. The method according to claim 10, comprising:
    implanting boron ions into the amorphous region activation annealing at a temperature of about 500° C. to about 900° C. to form the lightly doped source/drain regions.

12. The method according to claim 3, comprising sequentially:
    forming a dielectric layer on the surface of the silicon semiconductor substrate;
    forming a polycrystalline silicon layer on the dielectric layer;
    patterning the polycrystalline silicon layer to form a gate electrode on the dielectric layer;
    ion implanting impurities through the dielectric layer, using the gate electrode as a mask, to form the sub-surface non-amorphous and surface amorphous regions;
    patterning the dielectric layer to form a gate dielectric layer under the polycrystalline silicon gate electrode, thereby exposing the surface of the semiconductor substrate;
    ion implanting boron, using the gate electrode as a mask; and
    activation annealing to diffuse and activate the implanted boron ions to form the lightly doped source/drain regions.

13. The method according to claim 12, comprising sequentially:
    forming sidewall insulating spacers on side surfaces of the gate electrode after forming the sub-surface non-amorphous and amorphous silicon regions;
    ion implanting impurities and activation annealing to form moderate or highly doped source/drain regions;
    forming the sub-surface non-amorphous and surface amorphous regions;
    patterning the dielectric layer to form a gate dielectric layer under the gate electrode exposing the surface of the semiconductor substrate; and
    ion implanting boron into the surface amorphous region to form the lightly doped source/drain regions.

14. The method according to claim 2, comprising forming the sub-surface non-amorphous silicon region before forming the surface amorphous silicon region.

15. The method according to claim 2, comprising forming the surface amorphous silicon region before forming the sub-surface non-amorphous silicon region.

16. The method according to claim 1, wherein interstitials in the interstitial rich region are substantially annihilated.

* * * * *